United States Patent
Saxena et al.

(10) Patent No.: US 7,266,792 B2
(45) Date of Patent: Sep. 4, 2007

(54) AUTOMATED NOISE CONVERGENCE FOR CELL-BASED INTEGRATED CIRCUIT DESIGN

(75) Inventors: Prashant Saxena, Portland, OR (US); Kumar N. Lalgudi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 758 days.

(21) Appl. No.: 10/737,186

(22) Filed: Dec. 16, 2003

(65) Prior Publication Data

US 2005/0132309 A1  Jun. 16, 2005

(51) Int. Cl.
*G06F 17/50* (2006.01)

(52) U.S. Cl. .............................. 716/5; 716/6
(58) Field of Classification Search ........... 716/5–6
See application file for complete search history.

(56) References Cited

U.S. PATENT DOCUMENTS

| | | | |
|---|---|---|---|
| 6,363,516 B1 * | 3/2002 | Cano et al. ............... 716/5 |
| 6,389,581 B1 * | 5/2002 | Muddu et al. ............ 716/6 |
| 6,490,708 B2 * | 12/2002 | Cohn et al. .............. 716/4 |
| 6,507,935 B1 * | 1/2003 | Aingaran et al. ......... 716/5 |
| 6,675,118 B2 * | 1/2004 | Wanek et al. ............ 702/117 |
| 6,732,346 B2 * | 5/2004 | Horne et al. ............. 716/12 |
| 6,832,180 B1 * | 12/2004 | Sutera et al. ............ 703/13 |
| 7,058,907 B2 * | 6/2006 | Tuncer et al. ........... 716/2 |
| 7,086,018 B2 * | 8/2006 | Ito ........................ 716/4 |
| 7,111,259 B2 * | 9/2006 | Casavant ................. 716/6 |

* cited by examiner

*Primary Examiner*—Vuthe Siek
(74) *Attorney, Agent, or Firm*—Buckley, Maschoff & Talwalkar LLC

(57) ABSTRACT

According to some embodiments, a noise problem is automatically analyzed within the context of a cell-based integrated circuit design to identify an adjustment to the design in view of the perturbation to the design caused by the adjustment.

15 Claims, 8 Drawing Sheets

AUTOMATED NOISE CONVERGENCE FOR CELL-BASED INTEGRATED CIRCUIT DESIGN

BACKGROUND

In a Cell Based Design (CBD) process, pre-configured and pre-characterized circuit elements (referred to as "standard cells" or "cells") are arranged on a die and are connected to each other to create a circuit design. In some cases, the circuit design will cause problems with electrical noise. For example, a conductive path or "line" connecting two elements may have a noise problem that results in a signal integrity failure. Note that the number of noise problems may increase with the complexity of the circuit and/or the size of devices in the circuit (e.g., smaller transistor sizes and line widths might result in more noise problems).

When a noise problem occurs, an engineer can manually analyze the circuit design and identify potential adjustments to solve the problem. The engineer might, for example, re-route one line so that it is further away from another line (e.g., if he or she thinks the noise problem is caused by cross-capacitance coupling). In a complex circuit design, however, there might be thousands of noise problems. In this case, it may be impractical to manually analyze each problem to identify an appropriate adjustment (e.g., because such an approach could take too long to complete).

A number of different types of adjustments can be made to address a noise problem. For example, a line could be re-routed or shielded, a driver could be down-sized or up-sized, and/or a buffer might be added to a line. Moreover, any adjustment that is made to improve a noise problem can potentially have adverse consequences in other parts of the circuit. For example, re-routing a line to solve a noise problem might cause a signal timing problem, a slope problem, or even another noise problem (e.g., in a neighboring line).

DETAILED DESCRIPTION

Figure 1:
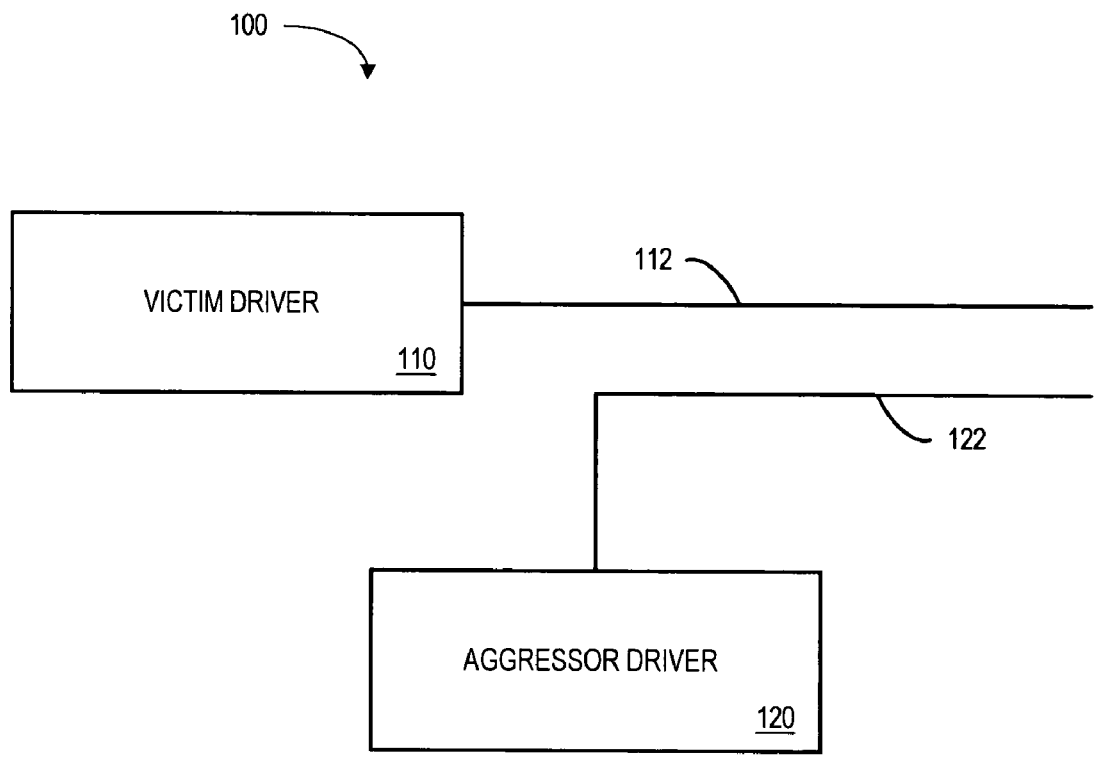
FIG. 1 is a block diagram of a portion of a CBD circuit.

In a CBD process, pre-configured and pre-characterized circuit elements called cells are arranged on a die and are connected to each other to create a circuit design. For example, FIG. 1 is a block diagram of a portion of a CBD circuit 100. The circuit 100 may, for example, be associated with a standard cell implemented using Complimentary Metal Oxide Semiconductor (CMOS) processor an Embedded Black Box (EBB) comprising circuits designed using individual transistors and/or cells.

The circuit 100 includes a victim driver 110 coupled to a victim line 122 and an aggressor driver 120 coupled to an aggressor line 122. In some cases, the victim line 122 will experience a noise problem (e.g., because of the aggressor line 122). To solve the noise problem, an adjustment can be made to the circuit 100. For example, the aggressor driver 120 might be down-sized or the victim driver 110 might be up-sized to reduce (or eliminate) the noise problem. When all of the noise problems in a design block under consideration have been solved, the block is said to have achieved "noise convergence."

Figure 2:
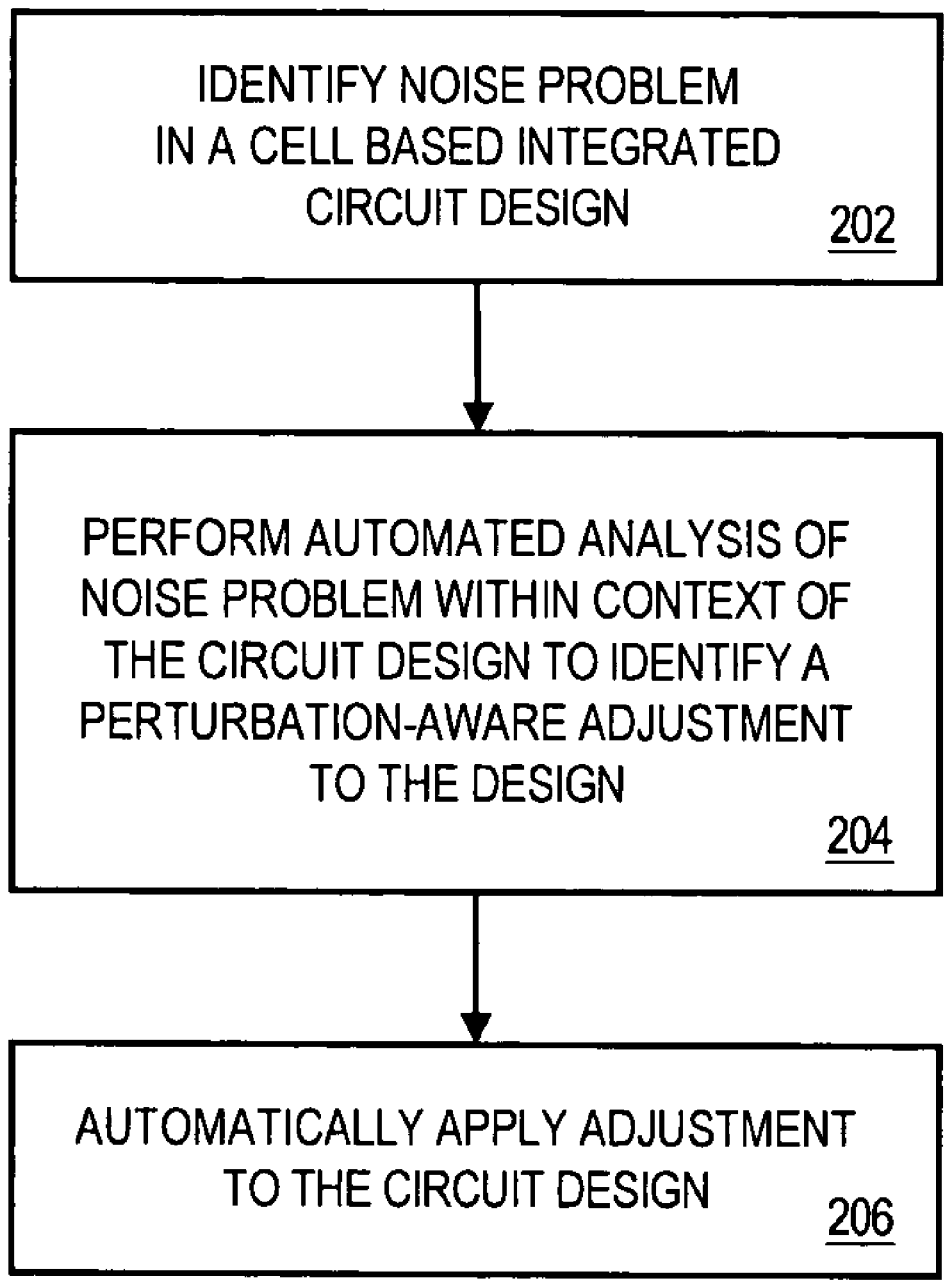
FIG. 2 is a flow chart of a method according to some embodiments.
Figure 3:
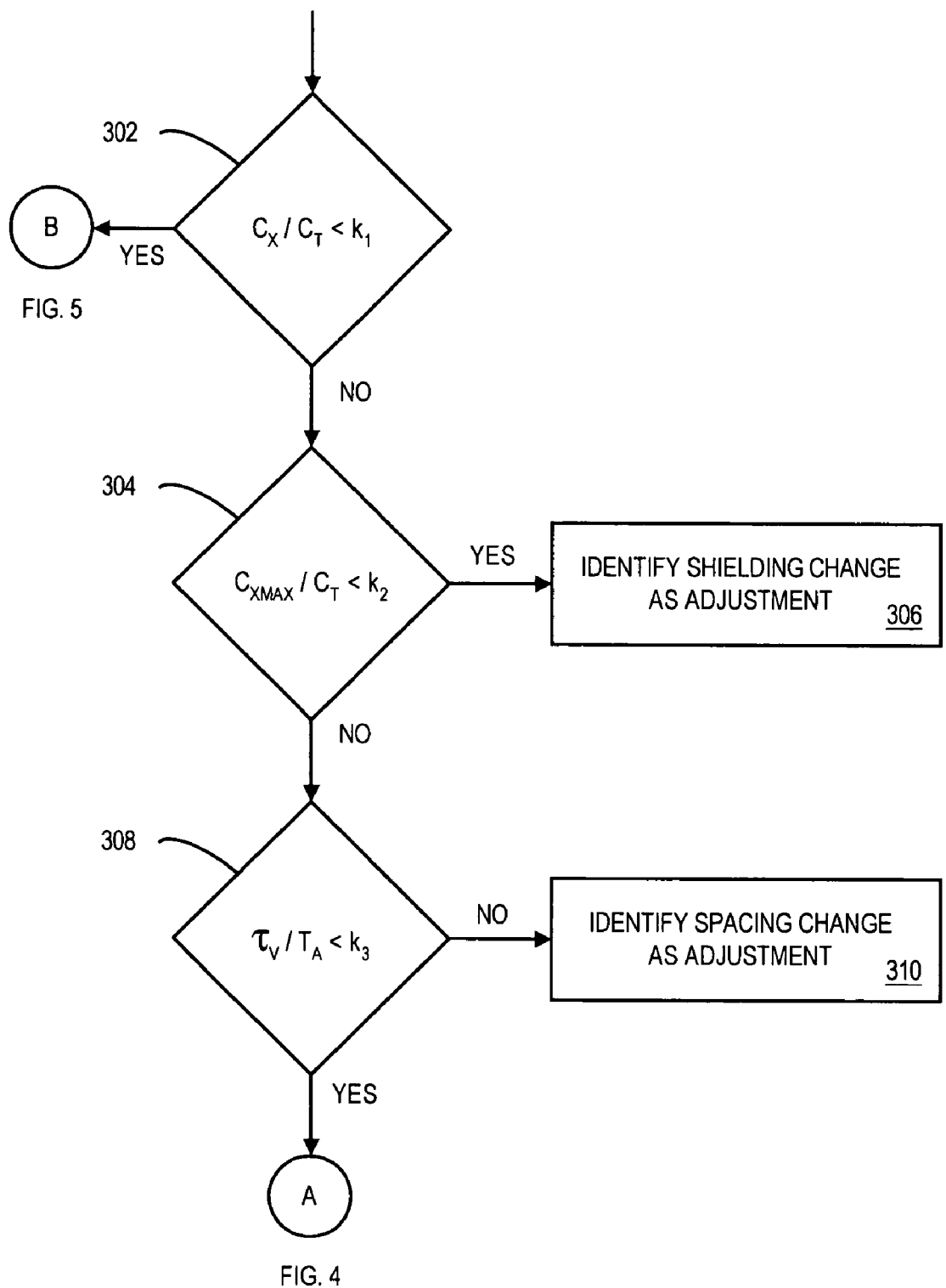
FIGS. 3 through 6 are a flow chart of a noise convergence method according to some embodiments.

FIG. 2 is a flow chart of a method to automatically apply such adjustments according to some embodiments. The flow charts described herein do not necessarily imply a fixed order to the actions, and embodiments may be performed in any order that is practicable. Note that any of the methods described herein may be performed by hardware, software (including microcode), or a combination of hardware and software. For example, a storage medium may store thereon instructions that when executed by a machine result in performance according to any of the embodiments described herein.

At 202, a noise problem is identified in a CBD circuit. For example, a noise analysis engine may perform timing and noise analysis after the detailed routing of lines for the circuit has been completed.

At 204, an automated analysis of the noise problem is performed within the "context" of the circuit design to identify an adjustment to the design. That is, the analysis of the problem is performed in view of the electrical parameters to which the noise problem may be most sensitive. The analysis is "perturbation-aware" within the context of the circuit design. That is, adjustments may be identified so as to reduce the likelihood of new timing or noise problems.

At 206, the adjustment is automatically applied to the circuit design. For example, the adjustment may be automatically provided to, and used by, a physical synthesis tool.

FIGS. 3 through 6 are a flow chart illustrating one example of a noise convergence method. At 302, the ratio of the total switching cross-capacitance ($C_x$) to the total capacitance of the victim net ($C_T$) is calculated. A ratio less than a pre-determined threshold value ($k_1$) might indicate that cross-capacitance is not the primary cause of the noise problem. Rather, the victim driver is too weak for the victim line, in which case the noise convergence method continues at FIG. 5.

A ratio greater than $k_1$, on the other hand, might indicate that the victim driver is subject to a significant amount of cross-capacitance coupling. In this case, it is determined whether or not a single aggressor is causing cross-capacitance coupling that significantly dominates the noise problem at 304. That is, the ratio of the coupled capacitance between the most strongly coupled aggressor and the victim ($C_{XMAX}$) to the total victim load ($C_T$) may be calculated and compared to a pre-determined threshold value ($k_2$). A ratio less than $k_2$ might indicate that no single aggressor is causing the noise problem. As a result, shielding the victim line from multiple aggressors can be identified as an appropriate adjustment to solve the noise problem at 306. For example, opportunistic shielding may use existing routing tracks adjacent to power rails in the circuit design to achieve some of the desired shielding.

If a single aggressor is causing most of the cross-capacitance coupling, an adjustment associated with that particular aggressor might be identified. For example, whether or not the noise problem is sensitive to changes in the aggressor's driver can be determined at 308. According to some embodiments, the ratio of victim's time constant ($\tau_v$) to the aggressor signal slope ($T_A$) is calculated and compared to a pre-determined threshold value ($k_3$). A ratio greater than $k_3$ may indicate that the noise problem is not sensitive to changes in aggressor driver, and therefore a spacing change is identified as the appropriate adjustment at 310 (e.g., the victim and/or the aggressor lines may be re-routed to increase the separation between them). The spacing may also improve the delay of the victim net by reducing the total capacitive load being driven.

Figure 4:
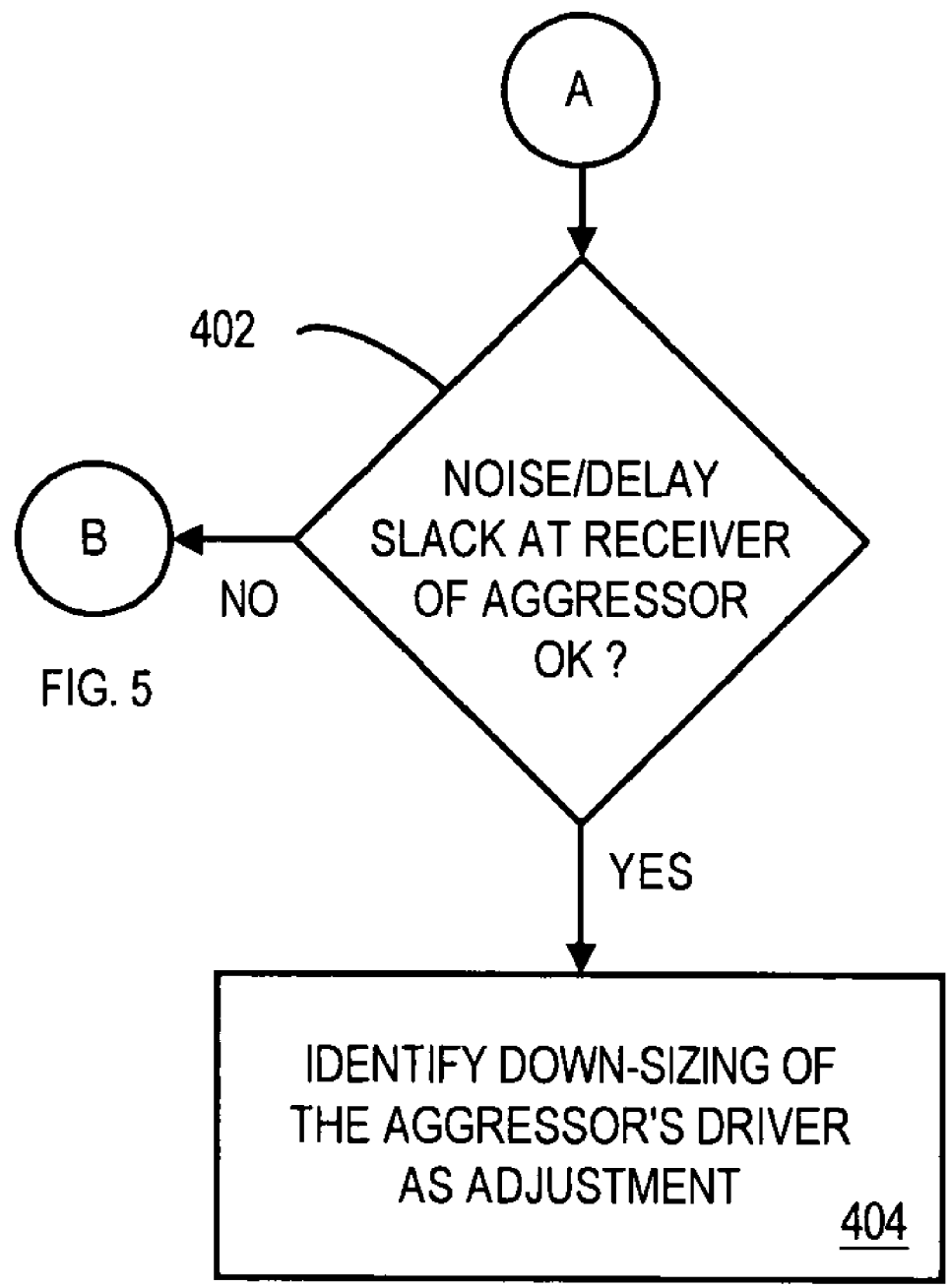

A ratio less than $k_3$ may indicate that the noise problem is sensitive to the aggressor driver. Referring now to FIG. 4, in this case it is determined whether or not there is sufficient noise and/or delay slack at the aggressor's receiver at 402. If there is sufficient slack, down-sizing the aggressor's driver is identified as the appropriate adjustment at 404. When the noise and/or delay slack is insufficient, however, the noise convergence method continues at FIG. 5.

Figure 5:
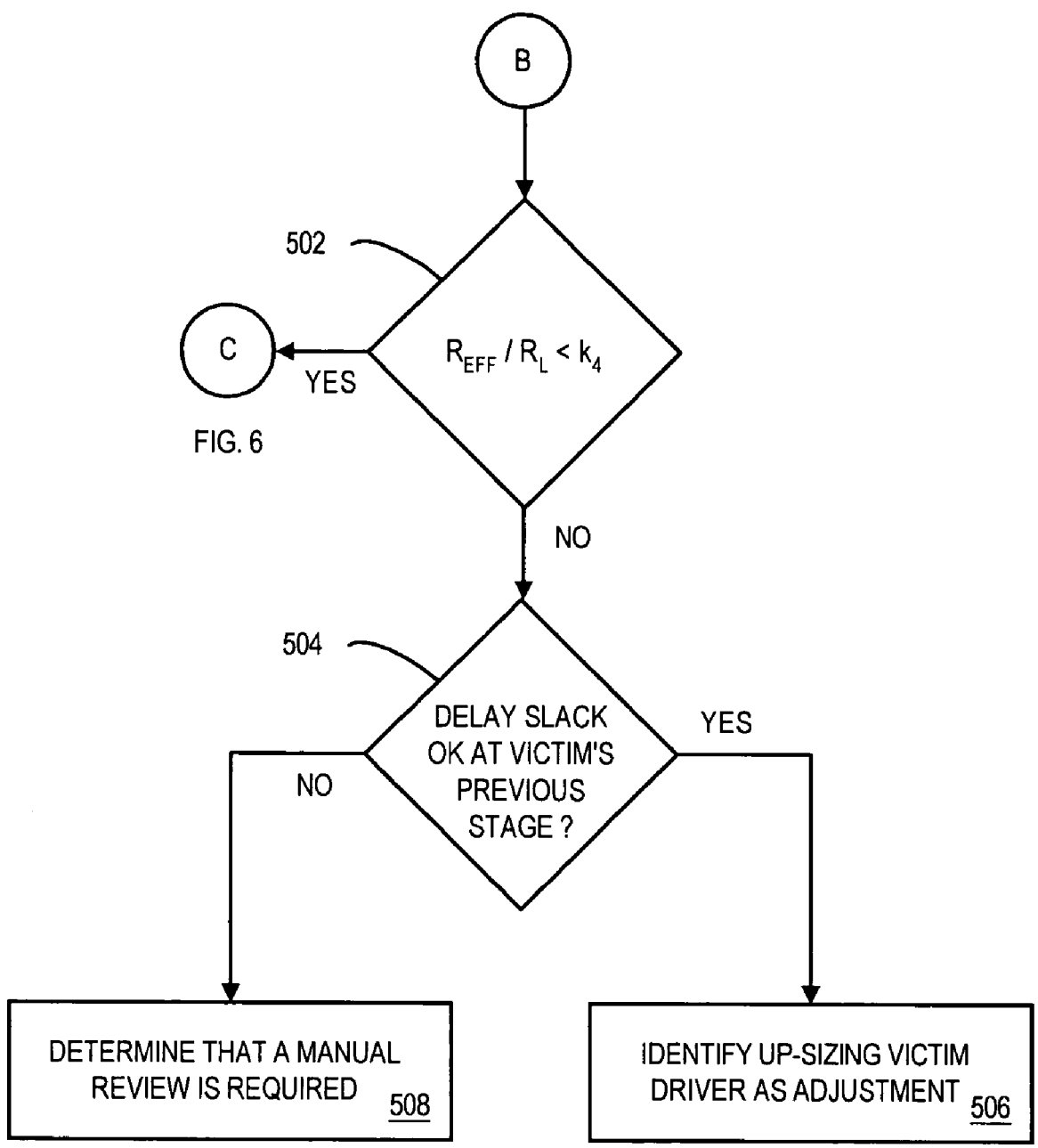

Referring now to FIG. 5, this portion of the method could be performed because the victim driver is too weak for the victim line or because, in the case of a victim driver being subject to significant cross-capacitance coupling, there is insufficient noise and/or delay slack at the aggressor's receiver (e.g., the aggressor's driver cannot be down-sized). In either case, the ratio of the resistance of the victim driver (e.g., a dynamically interpolated $R_{EFF}$) to the resistance of the victim wire ($R_L$) may be calculated and compared to a pre-determined threshold value ($k_4$) at 502. A ratio less than $k_4$ may indicate that line resistance dominates the noise problem, and the noise convergence method continues at FIG. 6.

A ratio greater than $k_4$ may indicate that driver resistance dominates the noise problem. In this case, if it is determined at 504 that there is sufficient noise and/or delay slack at the victim's previous stage, then up-sizing the victim driver is identified as the appropriate adjustment at 506. According to some embodiments, min-delay margins and/or violations at the receivers of the victim net are checked as well as max delay, slope, and noise violations at the inputs to the victim driver. When there isn't sufficient delay slack at the victim's previous stage, the noise convergence method may indicate that a manual review of the noise problem is required at 508. That is, an engineer might manually analyze the noise problem to see if a topology change to the circuit design is needed.

Figure 6:
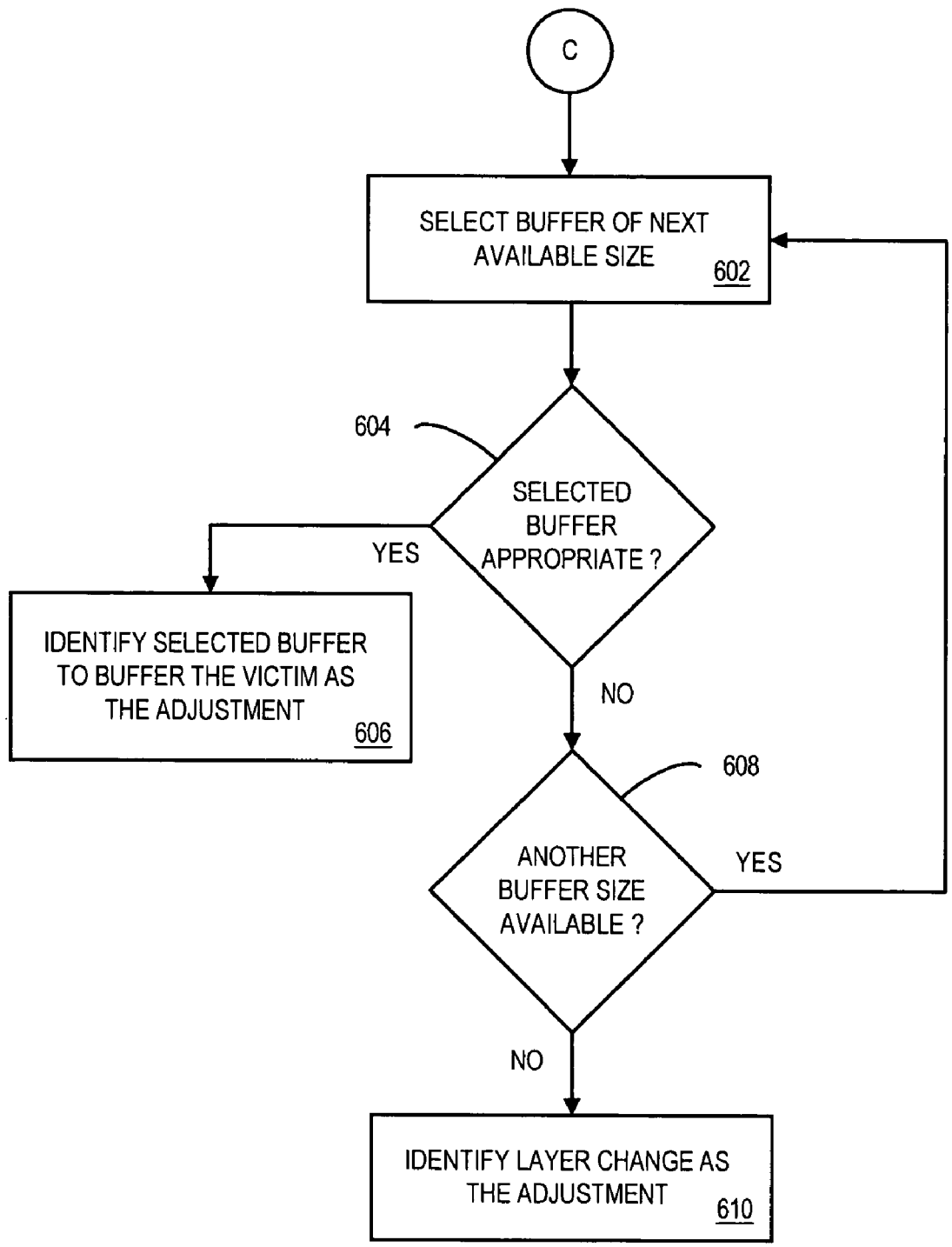

Referring now to FIG. 6, when line resistance dominates the noise problem (e.g., because the line is too long) a potential buffer for the victim line is selected at 602. For example, a smallest available buffer might be initially selected as a potential buffer. If the potential buffer is determined to be appropriate at 604 (e.g., the buffer provides sufficient noise and/or delay slack for the victim's receivers), that buffer is identified as the appropriate adjustment at 606.

If the potential buffer was not appropriate, it is determined whether another buffer is available at 608 (e.g., whether a next-larger buffer is available). If so, the new buffer is selected as the potential buffer and the process continues at 602. When there are no other buffers left (e.g., none of the available buffers were appropriate), a layer change is identified as the appropriate adjustment at 610. For example, the victim line might be moved to an upper metal layer.

Note that the flow chart described with respect to FIGS. 3 through 6 is implicitly sensitivity-aware and perturbation-aware. That is, the adjustments that are the most likely to fix the noise problem—and, at the same time, are the least likely to cause other problems in the circuit—may identified for different types of noise problems. As a result, the adjustments can be automatically incorporated into the circuit design—significantly reducing the time and expense associated with designing an integrated circuit using a CBD methodology.

Figure 7:
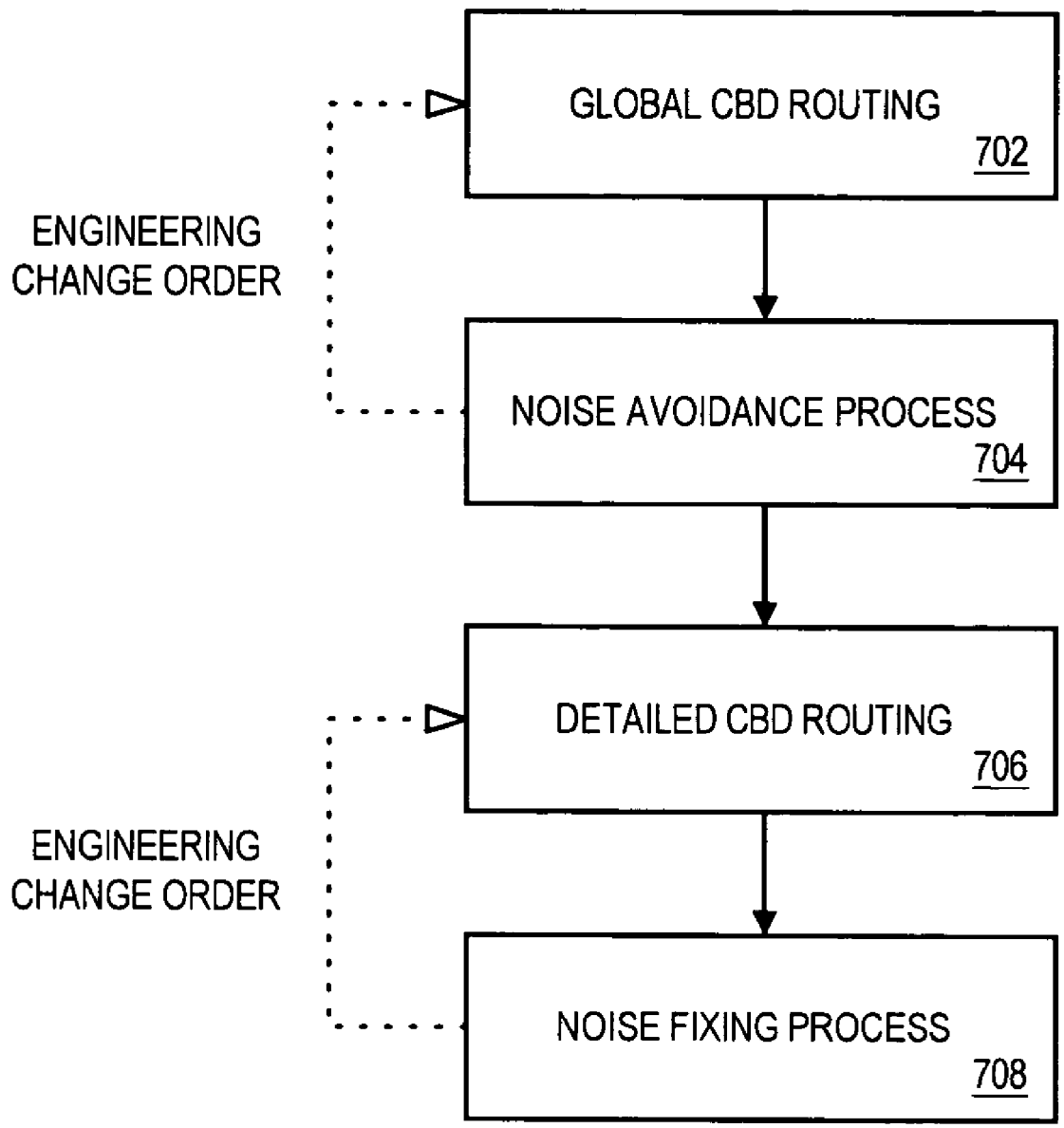
FIG. 7 is a flow chart of a circuit design method according to some embodiments.

FIG. 7 is a flow chart of a circuit design method according to some embodiments. At 702, global CBD routing is performed. The global routing may follow, for example, these design activities: establishing a block-level floor plan, synthesizing a scan and clock tree, and fixing violations (e.g., in slopes and maximum cell loading). At this global routing stage, only a rough estimation of interconnect cross-coupling and signal degradation will be available (and, therefore, many noise problems may not be identified yet).

A noise avoidance process is then executed at 704. For example, the noise avoidance process may be performed according to any of the embodiments described herein (e.g., for those noise problems that can be identified at this point). It may also generate Engineering Change Orders (ECOs) to address noise problems. The ECOs may then automatically result in changes to the global routing and the circuit. An ECO might comprise, for example, commands implemented as automatic scripts for a physical synthesis tool.

At 706, detailed routing is performed. For example, the line routing details may be determined and a parasitic extraction, a static timing analysis, and/or a noise analysis may be performed (e.g., by a noise analysis engine). A noise fixing process is then executed at 708 based on the detailed information that is now available. As before, ECOs can be generated and automatically incorporated in the circuit design, although the specific choice of ECOs at this stage will differ from those generated during global routing.

Figure 8:
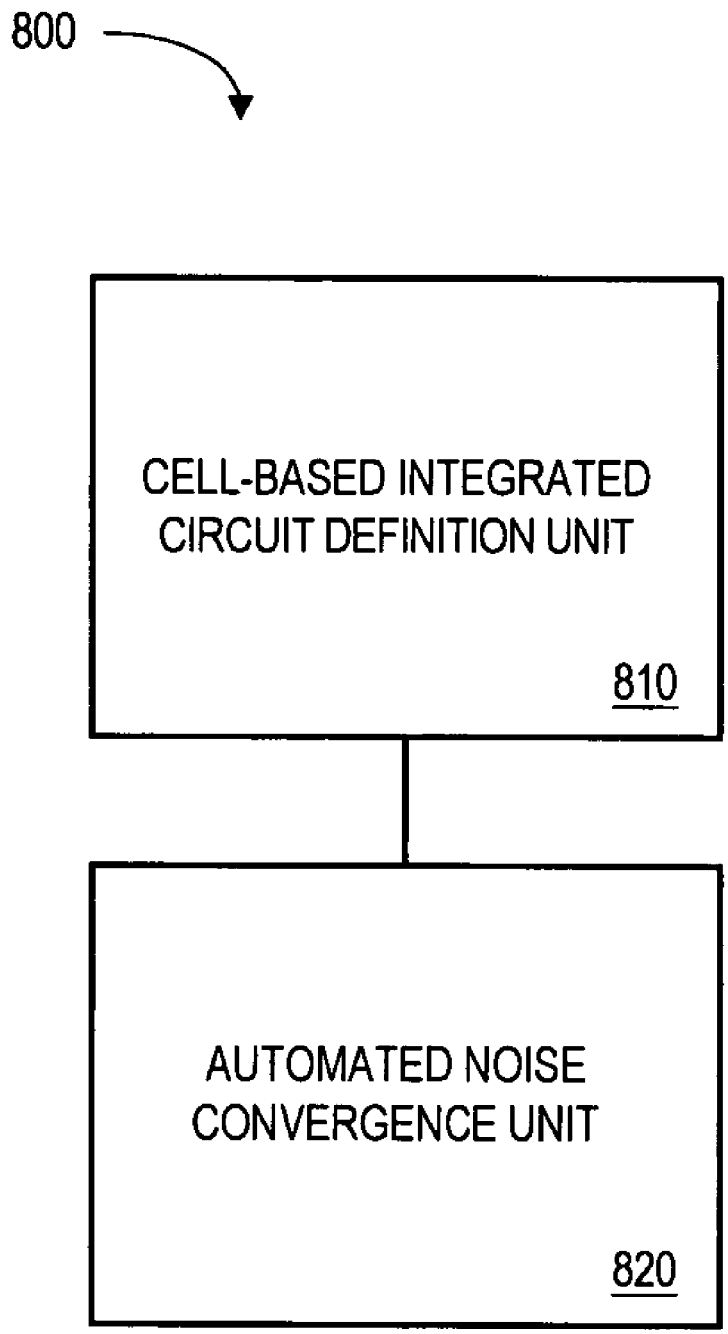
FIG. 8 is an example of a system according to some embodiments.

FIG. 8 is an example of a system 800 according to some embodiments. The system includes a cell-based integrated circuit definition unit 810 that generates a circuit design. The unit 810 may include or be associated with, for example, a physical synthesis tool. An automated noise convergence unit 820 can then exchange information with the definition unit 810 to analyze noise problems within the context of the circuit design and identify appropriate adjustments to the design. The adjustment may then be automatically applied to the circuit design (e.g., by the physical synthesis tool).

Note that a number of different noise problems can simultaneously exist in a circuit design. According to some embodiments, the noise convergence unit 820 avoids modifying the same net more than once during a pass of a noise convergence flow. Moreover, the failing nets may be ordered by increasing noise slack so that the most serious failures can be fixed first (when there is more flexibility with respect to the changes that can be made). Similarly, the dominant aggressor nets for a given victim may be ordered by decreasing cross-talk. According to some embodiments, the noise convergence method may avoid the spacing or shielding of bit-lines in a bus (except, perhaps, the first or last bits) in order to avoid a large area penalty.

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although particular adjustments have been described to address noise problems, additional adjustments may be included in the noise convergence algorithm. Similarly, less than all of the adjustments described herein might be included in the noise convergence algorithm.

The several embodiments described herein are solely for the purpose of illustration. Persons skilled in the art will recognize from this description other embodiments may be practiced with modifications and alterations limited only by the claims.

What is claimed is:

1. A method, comprising:

identifying a noise problem in a cell-based integrated circuit design, the noise problem being associated with a victim driver coupled to a victim line and an aggressor driver coupled to an aggressor line;

performing an automated analysis of the noise problem within the context of the circuit design to identify an adjustment to the design, wherein the analysis is perturbation-aware within the context of the circuit design and includes at least in part:

determining that the victim driver is too weak for the victim line, determining that line resistance dominates the noise problem, if an appropriate buffer can be identified, selecting the appropriate buffer to be associated with the victim line as the adjustment, and if no appropriate buffer can be identified, identifying a layer change as the adjustment;

automatically applying the adjustment to the circuit design; and outputting information associated with the adjusted circuit design.

2. The method of claim 1, wherein identification of the appropriate buffer comprises:

selecting the smallest available buffer;

determining if the selected buffer resolves the noise problem; and if the smallest available buffer does not resolve the noise problem, selecting the next larger buffer, wherein the process is repeated until (i) an appropriate buffer is identified or (ii) it is determined that no available buffer is appropriate.

3. The method of claim 2, wherein the determination that the victim driver is too weak for the victim line comprises:

calculating a ratio of the total switching cross-capacitance of the victim line to the total capacitance driven by the victim's driver; and checking whether the ratio is smaller than a pre-determined threshold value.

4. The method of claim 1, wherein the automated analysis at least in part includes:

determining that the victim driver is too weak for the victim line;

determining that driver resistance dominates the noise problem; and identifying up-sizing the victim driver as the adjustment.

5. A method, comprising:

identifying a noise problem in a cell-based integrated circuit design, the noise problem being associated with a victim driver coupled to a victim line and an aggressor driver coupled to an aggressor line;

performing an automated analysis of the noise problem within the context of the circuit design to identify an adjustment to the design, wherein the analysis is perturbation-aware within the context of the circuit design and includes at least in part:

determining that the victim driver is too weak for the victim line, determining that driver resistance dominates the noise problem by (i) calculating a ratio of a dynamically interpolated effective resistance of the victim driver to the resistance of the victim wire, and (ii) checking whether the ratio is larger than a pre-determined threshold value, and identifying up-sizing the victim driver as the adjustment;

automatically applying the adjustment to the circuit design; and outputting information associated with the adjusted circuit design.

6. The method of claim 5, wherein the automated analysis may further determine that a manual review of the noise problem is required.

7. A method, comprising:

identifying a noise problem in a cell-based integrated circuit design;

performing an automated analysis of the noise problem within the context of the circuit design to identify an adjustment to the design, including at least in part:

determining that a victim line is subject to significant cross-capacitance coupling;

if no single aggressor is causing a cross-capacitance coupling that significantly dominates the noise problem, identifying a shielding change as the adjustment; and if a single aggressor is causing cross-capacitance coupling that significantly dominates the noise problem, identifying an adjustment with respect to that aggressor;

automatically applying the adjustment to the circuit design; and outputting information associated with the adjusted circuit design.

8. The method of claim 7, wherein the determination that a single aggressor is causing cross-capacitance coupling that significantly dominates the noise problem comprises:

calculating a ratio of a coupled capacitance between that aggressor and the victim to the total capacitance driven by the victim's driver; and checking whether the ratio is larger than a pre-determined threshold value.

9. The method of claim 7, wherein the adjustment with respect to that aggressor comprises:

if the noise problem is sensitive to a driver associated with the aggressor, identifying down-sizing that driver as the adjustment; and if the noise problem is not sensitive to the driver associated with the aggressor, identifying a spacing change as the adjustment.

10. The method of claim 9, wherein a determination that the noise problem is sensitive to a driver associated with the aggressor comprises:

calculating a ratio of a victim time constant to an aggressor signal slope; and comparing the ratio to a pre-determined threshold value.

11. The method of claim 7, wherein the integrated circuit design is associated with standard cell designs implemented using a complimentary metal oxide semiconductor process.

12. The method of claim 7, wherein said outputting comprises at least one of:

(i) printing an engineering change order, (ii) transmitting an engineering change order, or (iii) providing adjusted scripts to a physical synthesis tool.

13. The method of claim 7, wherein the automated analysis is associated with at least one of: (i) a noise avoidance process, or (ii) a noise fixing process.

14. An article, comprising:

a computer-readable storage medium having stored thereon instructions that when executed by a machine result in the following:

identifying a noise problem in a cell-based integrated circuit design;
performing an automated analysis of the noise problem within the context of the circuit design to identify an adjustment to the design, including at least in part:
 determining that a victim line is subject to significant cross-capacitance coupling,
 if no single aggressor is causing a cross-capacitance coupling that significantly dominates the noise problem, identifying a shielding change as the adjustment, and
 if a single aggressor is causing cross-capacitance coupling that significantly dominates the noise problem, identifying an adjustment with respect to that aggressor;
automatically applying the adjustment to the circuit design; and
outputting information associated with the adjusted circuit design.

15. A system, comprising:
a cell-based integrated circuit definition unit to generate a circuit design;
an automated noise convergence unit to analyze a noise problem within the context of the circuit design to identify an adjustment to the design, wherein the adjustment is automatically applied to the circuit design and includes, at least in part:
 determining that a victim line is subject to significant cross-capacitance coupling,
 if no single aggressor is causing a cross-capacitance coupling that significantly dominates the noise problem, identifying a shielding change as the adjustment, and
 if a single aggressor is causing cross-capacitance coupling that significantly dominates the noise problem, identifying an adjustment with respect to that aggressor; and
an automated noise convergence output to transmit information associated with an adjusted circuit design.

* * * * *